(12) United States Patent
Nazarian

(10) Patent No.: US 7,388,779 B2
(45) Date of Patent: Jun. 17, 2008

(54) MULTIPLE LEVEL PROGRAMMING IN A NON-VOLATILE DEVICE

(75) Inventor: Hagop A. Nazarian, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/454,737

(22) Filed: Jun. 16, 2006

(65) Prior Publication Data

US 2006/0245257 A1 Nov. 2, 2006

Related U.S. Application Data

(62) Division of application No. 11/065,986, filed on Feb. 25, 2005, now Pat. No. 7,221,592.

(51) Int. Cl.
*G11C 11/34* (2006.01)
*G11C 16/04* (2006.01)

(52) U.S. Cl. .............. 365/185.03; 365/185.18

(58) Field of Classification Search .......... 365/185.03, 365/185.18
See application file for complete search history.

(56) References Cited

U.S. PATENT DOCUMENTS

| | | | |
|---|---|---|---|
| 6,058,042 A * | 5/2000 | Nobukata | 365/185.03 |
| 6,147,910 A | 11/2000 | Hsu | |
| 6,181,604 B1 | 1/2001 | Lu | |
| 6,538,923 B1 | 3/2003 | Parker | |
| 6,845,060 B2 | 1/2005 | Lee | |
| 2005/0248992 A1* | 11/2005 | Hwang et al. | 365/185.28 |

* cited by examiner

*Primary Examiner*—Huan Hong
*Assistant Examiner*—Kretelia Graham
(74) *Attorney, Agent, or Firm*—Leffert, Jay & Polglaze, P.A.

(57) ABSTRACT

The programming method of the present invention minimizes program disturb by initially programming cells on the same wordline with the logical state having the highest threshold voltage. The remaining cells on the wordline are programmed to their respective logical states in order of decreasing threshold voltage levels.

5 Claims, 4 Drawing Sheets

MULTIPLE LEVEL PROGRAMMING IN A NON-VOLATILE DEVICE

RELATED APPLICATION

This Application is a Divisional of U.S. application Ser. No. 11/065,986, titled "MULTIPLE LEVEL PROGRAMMING IN A NON-VOLATILE MEMORY DEVICE," filed Feb. 25, 2005, now U.S. Pat. No. 7,221,592 which is commonly assigned and incorporated herein by reference.

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance and complexity of electronic systems increase, the requirement for additional memory also increases. However, in order to continue to reduce the costs of a system, the parts count must be kept to a minimum. This can be accomplished by increasing the memory density of an integrated circuit.

One way to increase memory density is to use multi-level cell (MLC) non-volatile memory. This method stores two or more data bits in each memory cell. One problem with MLC is that subsequent programming of additional data can cause a program disturb condition that can program bits that are not desired to be programmed. This is caused by placing a large programming voltage on a wordline that is shared by cells that have already been programmed.

For the reasons stated above, and for other reasons stated below which will become apparent to those skilled in the art upon reading and understanding the present specification, there is a need in the art for a way to program MLC non-volatile memory cells while reducing program disturb.

DETAILED DESCRIPTION

Figure 1:
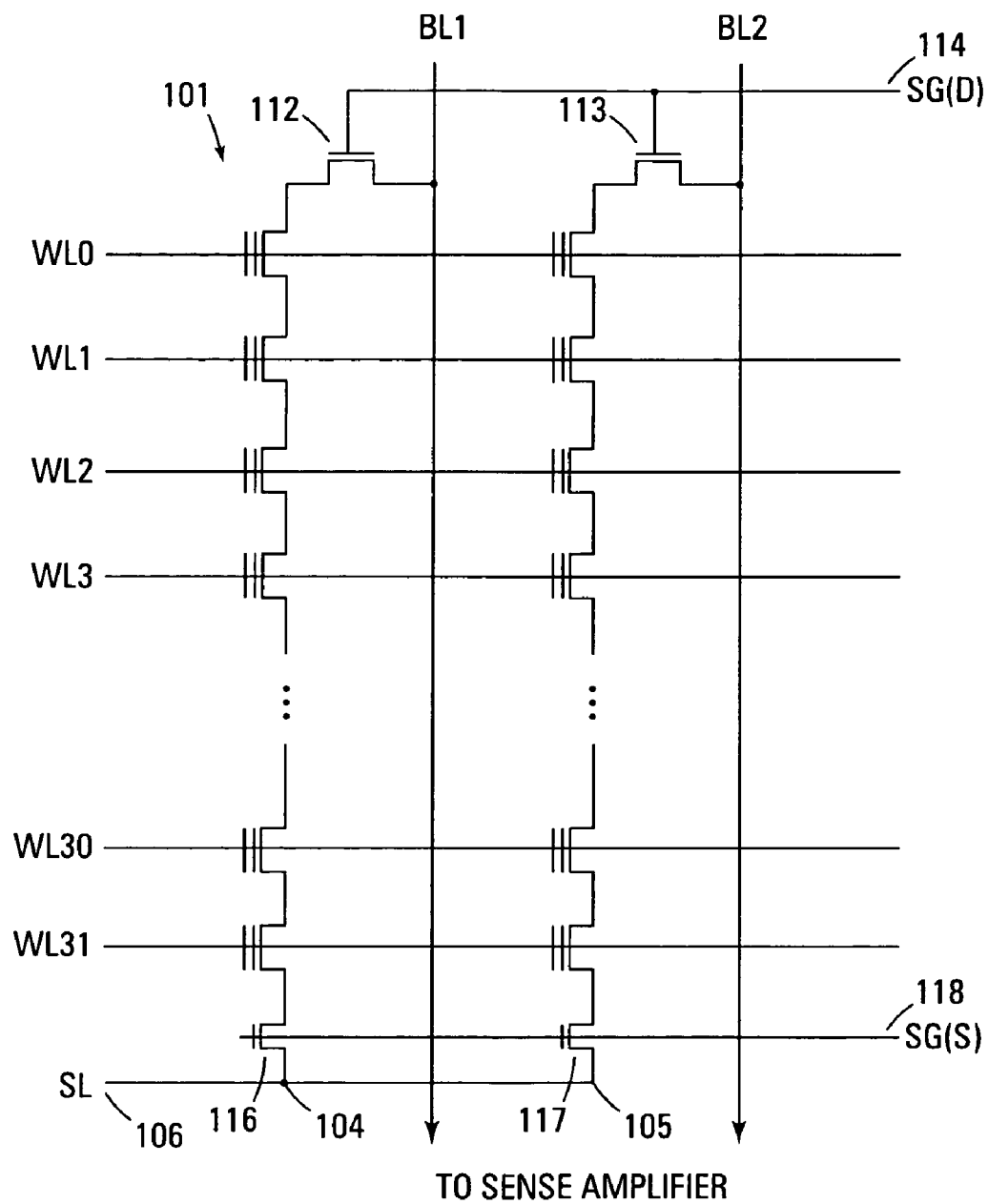
FIG. 1 shows a simplified diagram of one embodiment for a NAND flash memory array of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a simplified diagram of one embodiment for a NAND flash memory array of the present invention. This memory is for purposes of illustration only as the present invention is not limited to NAND flash but can be used for other non-volatile memory technologies such as electrically erasable programmable read only memory (EEPROM).

The memory array of FIG. 1, for purposes of clarity, does not show all of the elements typically required in a memory array. For example, only two bitlines are shown (BL1 and BL2) when the number of bitlines required actually depends upon the memory density. The bitlines are subsequently referred to as (BL1-BLN).

The array is comprised of an array of floating gate cells 101 arranged in series strings 104, 105. Each of the floating gate cells 101 are coupled drain to source in each series string 104, 105. A word line (WL0-WL31) that spans across multiple series strings 104, 105 is coupled to the control gates of every floating gate cell in a row in order to control their operation. The bitlines (BL1-BLN) are eventually coupled to sense amplifiers (not shown) that detect the state of each cell.

In operation, the wordlines (WL0-WL31) select the individual floating gate memory cells in the series string 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bitline (BL1-BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

Each cell can be programmed as a single bit per cell (i.e., single level cell—SBC) or MLC. Each cell's threshold voltage ($V_t$) determines the data that is stored in the cell. For example, in a single bit per cell, a $V_t$ of 1V might indicate a programmed cell while a $V_t$ of −1V might indicate an erased cell. The multilevel cells have more then two $V_t$ windows that each indicates a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage $V_t$ distributions. The width of the distribution is ~200 mV. Typically, a separation of 0.3 VV to 0.5V is assigned between each VT distribution range as well. This separation zone between the $V_t$ distributions is to insure that the multi $V_t$ distributions do not overlap causing logic errors. During verification, if the voltage stored on the cell is sensed to be within the 01 high $V_t$ distribution, then the cell is storing a 01. If the voltage is within the 00 second highest distribution, the cell is storing a 00. This continues for as many ranges that are used for the cell.

The embodiments of the present invention are not limited to two bits per cell. Some embodiments may store more than two bits per cell, depending on the quantity of different voltage ranges that can be differentiated on the cell.

During a typical programming operation, the selected wordline for the flash memory cell to be programmed is applied with a train of high voltage programming pulses. These high voltage programming pulses typically start at 16 v and increment in 0.5V increments. A 10V non-incrementing, high voltage pulse is applied on the unselected WLs.

To inhibit selected cells from programming on the selected WL, the channel of the inhibited cell is decoupled from the BL by applying ~1.3 v on the BL. The channel area of these devices will rise with the WL pulse based on the coupling coefficient of the memory cell so that the differential voltage between the WL and the channel will not be sufficient to program the cell.

To program selected cells on the selected WL, the channel is grounded to 0 v through the BL. The large potential formed between the channel, and the WL will cause the cell to program and the $V_t$ of the device will increase as higher programming pulses are applied.

Between every programming pulse a verification phase is performed. During verification, the selected WL is lowered to 0V, the unselected WLs are lowered to 5V, and the states of the selected cells are sensed. If the cell is programmed to have a $V_t$ level such that the 0 v on the WL cannot make the device to conduct, the device is considered to be programmed. Otherwise the cell is considered to be still erased and the programming pulse height is increased by 0.5V and applied to the selected WL again. This process is repeated until all selected cells that need to be programmed are all programmed.

A typical memory block is comprised of 64 logical pages. The 64 pages are formed with 32 physical WLs. Each WL contains 2 logical pages. For example, there are 4 Kbit cells on a WL. 2 Kbit is dedicated for one page that shares the same WL with another 2 Kbit page. If every cell is used in a multi $V_t$ distribution level mode then a WL will hold 4 pages of 2 Kbit per page. When one of these pages is being programmed the second page on the same WL will experience disturb condition even though it is inhibited. Therefore pages with shared WLs can experience programming disturb. The programming disturb caused on the shared WL will shift the $V_t$ distribution of cells that are previously programmed in the second page that is on the same WL and make their distribution wider. For non-volatile memory devices that use two levels per cell this may not be a major problem since the separation zone between the two distributions is large enough to prevent the distributions from overlapping due to disturb. However, for multi level cell (MLC) operation where a single cell is used to represent 2 bits or 4 levels per physical single cell, the separation zone is reduced and reducing disturb becomes extremely important in order to prevent $V_t$ distributions from overlapping or shifting.

Prior art, multi page programming algorithms follow a special programming sequence in order to minimize the disturb condition due to cell-to-cell floating gate coupling issues. The sequence in which the prior art $V_t$ distribution is programmed is based on the cell-to-cell coupling issues. This is an important factor to consider in minimizing the cell-to-cell floating gate coupling to the $V_t$ distribution. However, it is also important to consider minimizing the number of the highest voltage pulses being applied to the WL to program all pages on the same WL in order to minimize the shared WL disturb condition.

The prior art method of programming a multi-level cell, starting from the low $V_t$ distribution state to the highest $V_t$ distribution, may be a practical programming method but, from the programming disturb point of view, it is not an optimum method. After programming the lower $V_t$ distribution, the higher voltages needed to program the higher $V_t$ distributions will disturb the already programmed lower $V_t$ distribution due to the higher voltage. By reversing this sequence, the disturb of the lower $V_t$ distribution will be minimized.

Figure 2:
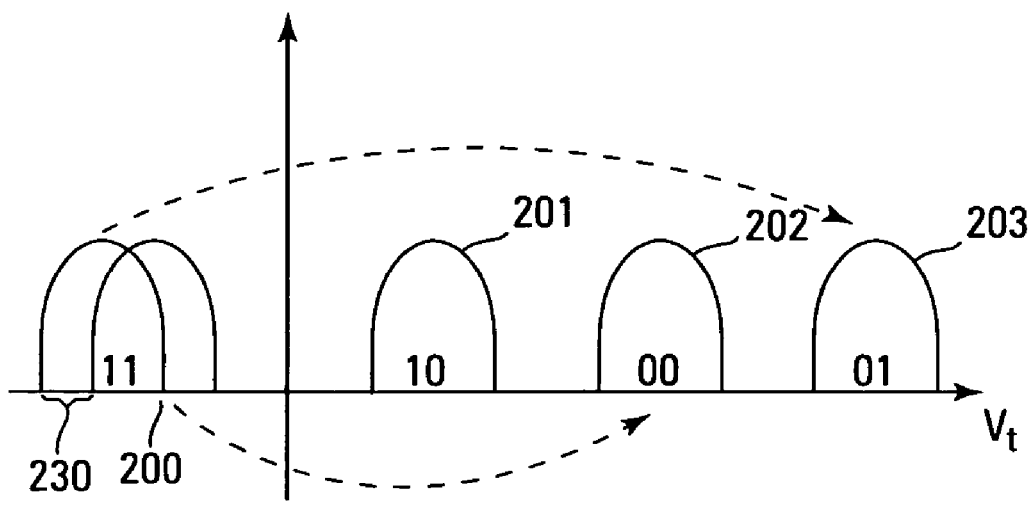
FIG. 2 shows a diagram of one embodiment of a method of the present invention for multiple level, first page programming of a memory block.

FIG. 2 illustrates a diagram of one embodiment of a method of the present invention for multiple level, first page programming of a memory block. This diagram shows that the page begins in a known erased state 200. In this embodiment, the erased state 200 is indicated by a logical "11" since both bits of the multi-bit cell are in a "1" state when erased. The erased state may be indicated by the logical "0" state in other memory devices.

When a programming operation is performed, the embodiment of FIG. 2 starts with the programming of the highest threshold voltage distribution and programs in decreasing order of threshold voltage distribution. Statistically, this places the highest voltage on the wordline prior to all the lower multi-level distributions being programmed and, therefore, minimizing the chance to cause disturb conditions with the other cells on the same wordline that are planned to be programmed to lower $V_t$ distributions.

As an example of operation, all of the cells in a page that have to be programmed with bits "01" are programmed first since this state 203 is the highest $V_t$. The next lowest state is a logical "00" so cells with this state 202 would be programmed next. These programming operations can be accomplished with consecutive programming and verification pulses where two verification pulses with two different levels are applied (i.e., 2V for 01, and 1.3V for 00) between every increasing programming pulse The diagram of FIG. 2 also shows the disturb created in the erased state 200 during the programming of the first page. The disturb is shown as the movement 230 of the $V_t$ state along the $V_t$ axis. This movement 230 can be substantial since the largest wordline voltage has just been experienced. However, usually the separation zone between the "11" and "10" states is larger than other states in order to make sure that the "11" state exposure to disturb is accounted for. "11" states will see the largest distribution shift since it is the lowest $V_t$, and is exposed to the largest number of inhibit pulses.

Figure 3:
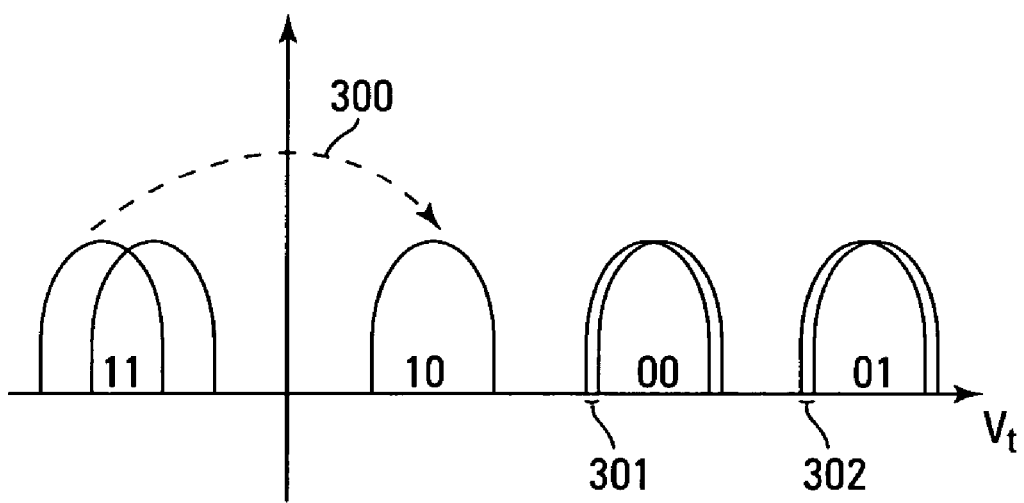
FIG. 3 shows a diagram of one embodiment of a method of the present invention for multiple level, second page programming of a memory block.

FIG. 3 illustrates a second page of programming in accordance with the embodiment of FIG. 2. This figure shows that cells that are to be programmed to the "10" state 201 are programmed last with a second page of incrementing programming voltage pulses 300. Incrementing programming pulses, and a verification pulse following each programming pulse, will program the "10" state. Statistically, since this is the $3^{rd}$ lowest $V_t$ distribution, the maximum applied voltage to program will not reach as high as the previous higher $V_t$ distribution needed. This puts the lowest programming voltage on the wordline after the first two states have already been programmed. While a slight amount of disturb 301 and 302 in the previously programmed states is going to be present, it is substantially less than that experienced with the prior art programming methods where the lower $V_t$ distributions are set before setting the highest $V_t$ distribution.

The bits that are mapped to the states 200-203 shown in FIGS. 2 and 3 are for purposes of illustration only. The present invention is not limited to having the state with the highest $V_t$ being a logical "01". For example, in an alternate embodiment, a "10" state might have the highest threshold voltage.

Figure 4:
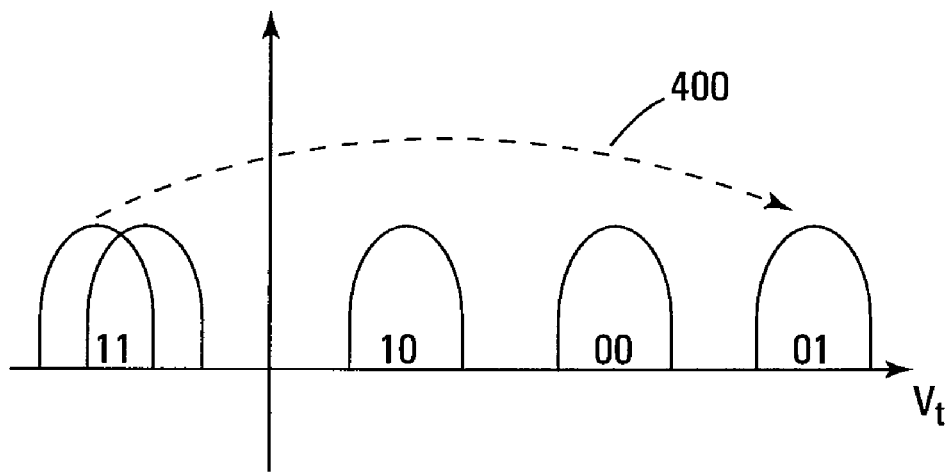
FIG. 4 shows a diagram of an alternate embodiment of a method of the present invention for multiple level, first page programming of a memory block.

FIG. 4 illustrates an alternate embodiment of the method of the present invention for programming multiple level, non-volatile memory cells. In this method, incrementing programming pulses and a single level verification pulse following each programming pulse will program 400 the "01" state. Statistically, since "01" requires the highest $V_t$ distribution the highest voltage on the WL will be applied before programming the lower $V_t$ distributions. This embodiment similarly programs the highest threshold voltage first to reduce the amount of disturb experienced by other cells sharing a wordline. In the embodiment of FIG. 4, a programming pulse at the highest programming voltage is generated to program the "01" state to the appropriate cells coupled to the wordline.

Figure 5:
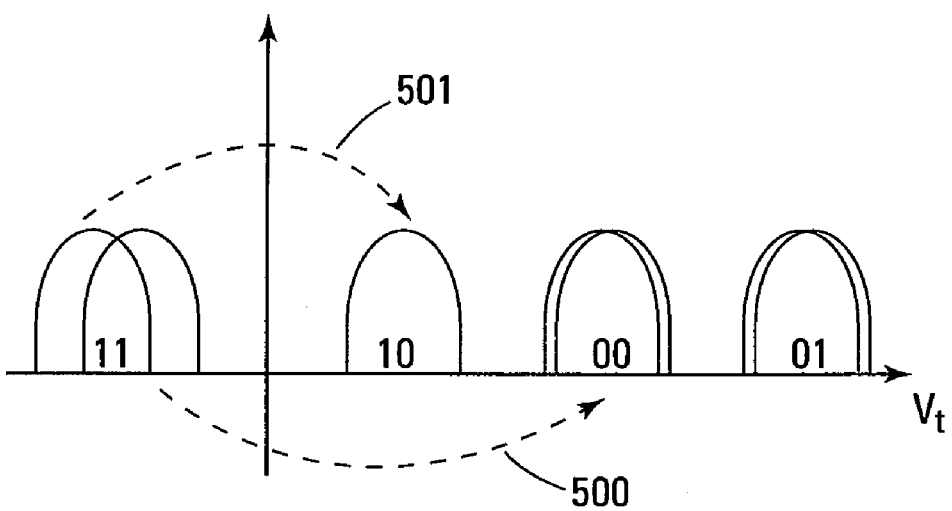
FIG. 5 shows a diagram of the alternate embodiment of a method of the present invention for multiple level, second page programming of a memory block.

FIG. 5 shows the second page of programming for the embodiment of FIG. 4. This page of programming generates programming pulses to program 500 and 501 the "00" and "10" states. Two verification pulses follow each programming pulse where two different levels are applied (i.e., 2V pulse for "01" and 1.3V pulse for "00") to the WL. By programming 500 and 501 the $V_t$ distributions in decreasing order of their threshold voltages, the least amount of program disturb is achieved to the previously programmed states within the same page and the previously programmed pages on the same WL.

The above-described embodiments of FIGS. 2-5 are for purposes of illustration only. The programming of non-volatile memory cells by programming in decreasing order of threshold voltages can be accomplished in various ways that have not been shown.

Figure 6:
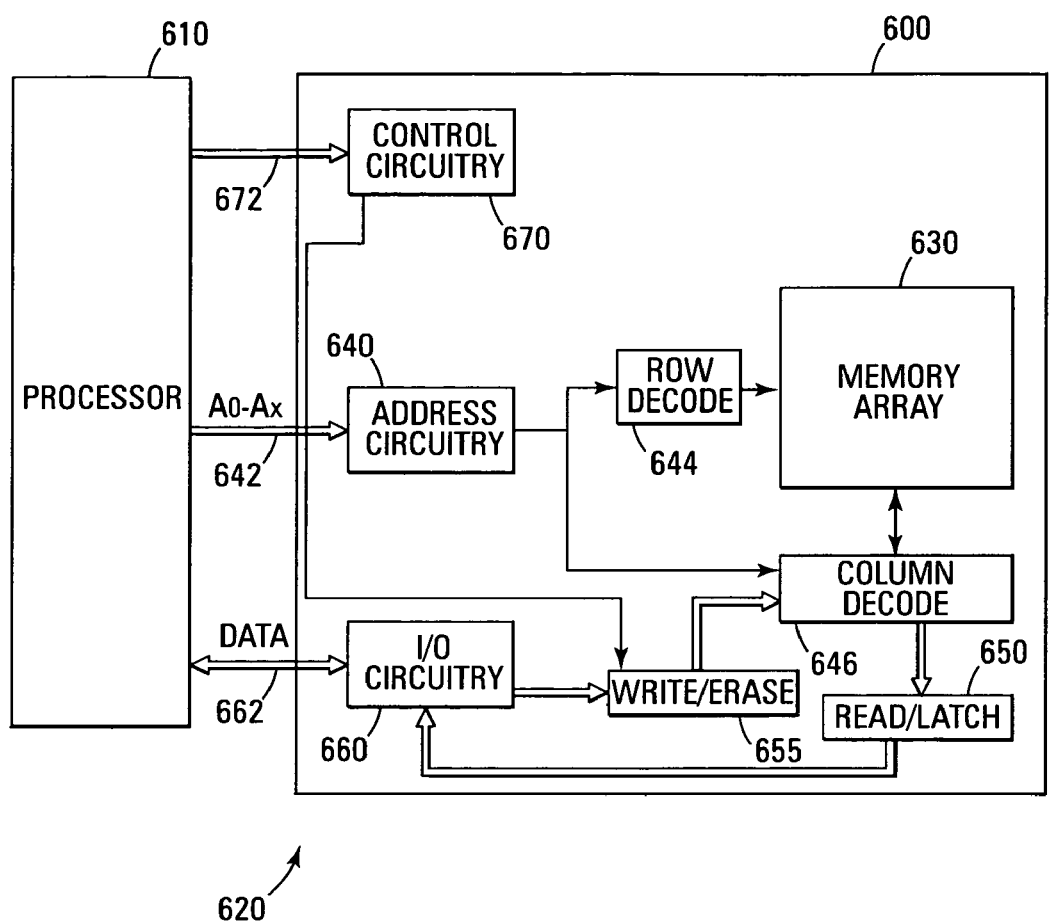
FIG. 6 shows a block diagram of one embodiment of an electronic system of the present invention.

FIG. 6 illustrates a functional block diagram of a memory device 600 that can incorporate the flash memory array and programming method embodiments of the present invention. The memory device 600 is coupled to a processor 610. The processor 610 may be a microprocessor or some other type of controlling circuitry. The memory device 600 and the processor 610 form part of an electronic system 620. The memory device 600 has been simplified to focus on features of the memory that are helpful in understanding the present invention.

The memory device includes an array of flash memory cells 630 as described above with reference to FIGS. 2 and 3. The memory array 630 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture or a NOR architecture.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over a plurality of data connections 662 with the processor 610. Write circuitry 655 is provided to write data to the memory array.

Control circuitry 670 decodes signals provided on control connections 672 from the processor 610. These signals are used to control the operations on the memory array 630, including data read, data write (program), and erase operations. The control circuitry 670 may be a state machine, a sequencer, or some other type of controller. In one embodiment, the control circuitry 670 is responsible for executing the embodiments of the programming method of the present invention.

The flash memory device illustrated in FIG. 6 has been simplified to facilitate a basic understanding of the features of the memory. A more detailed understanding of internal circuitry and functions of flash memories are known to those skilled in the art.

CONCLUSION

In summary, the embodiments of the present invention improve margins between MLC levels while maintaining programming throughput. This is accomplished by programming the higher $V_t$ distribution first then the lower distributions. This reduces the number of wordline programming voltages in order to minimize the program disturb of other cells on the wordline.

For example, one embodiment maps the logical "11" to the erased state and the logical "01" state to have the highest threshold voltage, thus requiring the highest programming voltage. The logical "00" state is mapped to the $3^{rd}$ highest threshold voltage and the logical "10" state to the $2^{nd}$ highest threshold voltage. Therefore, one embodiment of the present invention would first program a first page by programming cells on a wordline with the "01" state together with the logical "00" state. A second page, comprising the logical "10" state, can then be programmed. Since the lowest programming voltage is used last, the program disturb experienced by the first page is minimized.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a multiple level, non-volatile memory device, the method comprising:

applying a first series of incrementing programming voltage pulses to a wordline of the memory device to program a first set of memory cells of a plurality of memory cells, each memory cell having a plurality of programmable states wherein each state is represented by a threshold voltage distribution, a first maximum voltage of the first series of incrementing programming pulses being greater than remaining maximum programming voltages;

applying a second series of incrementing programming voltage pulses to the wordline to program a second set of memory cells, a second maximum voltage of the second series of incrementing programming voltage pulses being less than the first maximum voltage; and programming remaining memory cells on the wordline in decreasing order of threshold voltage distribution.

2. The method of claim 1 wherein the non-volatile memory device is one of a NAND architecture flash memory device or a NOR architecture flash memory device.

3. The method of claim 1 wherein the first maximum voltage is for programming a first state and the second maximum voltage is for programming a second state.

4. The method of claim 1 wherein the first set of memory cells all have a first threshold voltage distribution and the second set of memory cells all have a second threshold voltage distribution.

5. The method of claim 4 wherein the first threshold voltage distribution is greater than the second threshold voltage distribution.

* * * * *